United States Patent [19]

Plunkett

[11] Patent Number: 5,386,478
[45] Date of Patent: Jan. 31, 1995

[54] SOUND SYSTEM REMOTE CONTROL WITH ACOUSTIC SENSOR

[75] Inventor: Bradley J. Plunkett, Granada Hills, Calif.

[73] Assignee: Harman International Industries, Inc., Northridge, Calif.

[21] Appl. No.: 116,572

[22] Filed: Sep. 7, 1993

[51] Int. Cl.⁶ ............................................. H03G 5/00
[52] U.S. Cl. ................................................. 381/103
[58] Field of Search ................. 381/1, 28, 104, 105, 381/109, 86, 103, 101

[56] References Cited

U.S. PATENT DOCUMENTS 4,458,362  7/1984  Berkovitz et al. ............... 381/101
4,739,513  4/1988  Kunungi et al. .................. 381/103

Primary Examiner—Forester W. Isen
Attorney, Agent, or Firm—J. E. McTaggart

[57] ABSTRACT

Automatic closed loop adjustment of a stereo sound system optimizes the sound quality at a particular listening location as sensed there by a microphone in a hand-held remote control unit. Such automatic capability is particularly beneficial for asymmetrical locations and may be applied to optimization of perceived channel balance with regard to various parameters such as gain, equalization and time delay, and which are thus inconvenient to set up manually. A hand-held remote control capable of adjusting the stereo system, typically via an infrared link, is additionally equipped with a microphone which senses sound from each stereo loudspeaker at the listening location. The stereo unit is equipped to generate special test signals that are picked up by the microphone and analyzed to provide adjustment information via the remote control link to automatically adjust various parameters in each channel so as to optimize the sound quality as perceived at the particular current listening location where the remote control is located. The remote control's infrared link is utilized as part of a closed loop of an automatic control system in which acoustic information gathered by the microphone is analyzed to control compensatory adjustments.

11 Claims, 2 Drawing Sheets

SOUND SYSTEM REMOTE CONTROL WITH ACOUSTIC SENSOR

FIELD OF THE INVENTION

The present invention relates to the field of audio reproduction and more particularly it relates to automatic adjustment of a stereophonic system for optimal sound quality as perceived at a particular listening location.

BACKGROUND OF THE INVENTION

In an ideal environment for listening to stereo reproduction the louspeakers would be located symmetrically and the listener would be located symetrically relative to the two loudspeakers, i.e. on a center line between them. These ideals are seldom realized in practice; often the speaker environment is assymetric and/or the listening location is asymmetric relative to the speakers, so that inter-channel differences in sound path lengths and other acoustic properties detract from optimal perception of the stereophonic sound. Loudness unbalance can be corrected by the usual balance control provided, and EQ (amplitude versus frequency equalization) may be balanced if EQ capability is available independently in each channel. Unbalanced time delays due to the different acoustic path lengths in the two channels can be compensated by introducing additional time delay in the channel having the shorter acoustic path. Other available sound processing techniques may be applied in a particular manner in each channel to optimize a particular asymmetric listening location.

Setting these various compensations for optimal stereo listening as perceived at a particular location can be inconvenient and time-consuming. When the listening location changes, a new setup is usually required.

A remote control unit with the capability of controlling the necessary parameters independently on each channel is very beneficial since adjustment can be made by the listener from the listening location. Even with the remote control, making the necessary readjustments each time one relocates is tedious, and the difficulty increases sharply with the level of quality sought due to the increased number of audio parameters which must be adjusted and optimized each time.

For serious listeners in the field of high quality stereo, this is an unsolved problem: there is a growing and unfulfilled need for a user-friendly system for optimizing the stereo adjustments for particular listening locations.

OBJECTS OF THE INVENTION

It is a primary object of the present invention to provide in a stereo system the capability of automatic adjustment of various parameters so as to optimize the sound quality perceived at a particular listening location.

SUMMARY OF THE INVENTION

Automatic stereo adjustment relating to a particular listening location is provided by incorporating an acoustic sensor, i.e. a microphone with associated circuitry, in a hand-held remote control unit of the well known type which typically send commands to a main stereo unit via an IR (infrared) control link. The microphone, which is located at the listening location, picks up a special test signal generated from the loudspeakers on command; then, based on analysis of the signal picked up by the microphone, corrective adjustment of the stereo unit is introduced. The IR link is utilized to provide a signal path for the control feedback signal from the remote control unit at the listening location to the main unit, where corrective adjustment is introduced.

BRIEF DESCRIPTION OF THE DRAWINGS

The above and further objects, features and advantages of the present invention will be more fully understood from the following description taken with the accompanying drawings in which.

DETAILED DESCRIPTION

Figure 1:
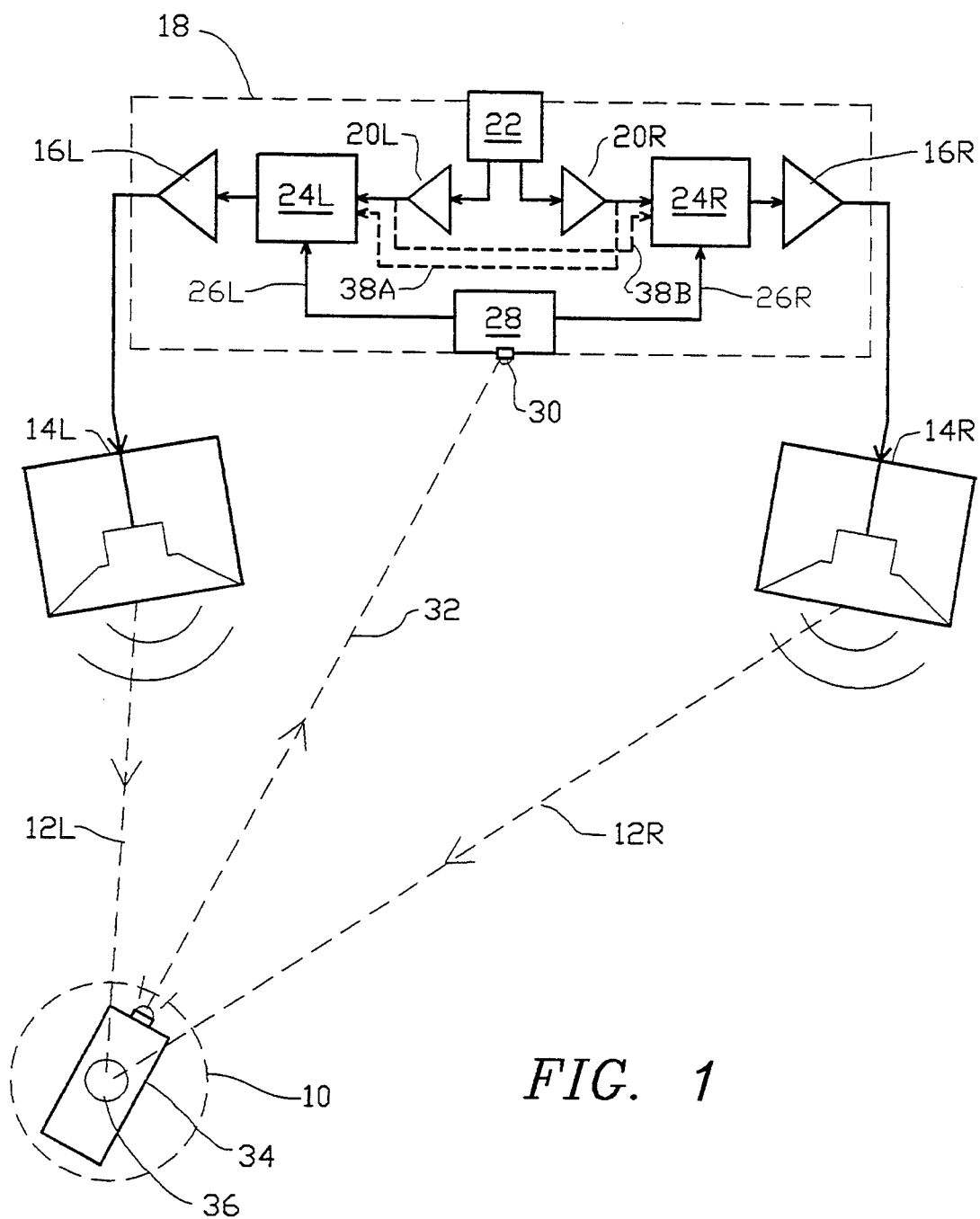
FIG. 1 is a simplified functional block diagram illustrating a stereo system with automatic compensatory adjustment for asymmetric listening locations, in accordance with the present invention.

FIG. 1 is a simplified functional block diagram of a stereo system equipped to operate in accordance with the present invention. At an asymmetric listening location 10, sound is received via an acoustic path 12L from a first loudspeaker 14L in the left channel and via a longer path 12R from the second loudspeaker 14R in the right channel. Loudspeakers 14L and 14R are driven from power amplifiers 16L and 16R respectively of a stereo system 18 containing a pair of preamplifiers 20L and 20R receiving input from stereo source block 22, that typically includes switched selection from the usual stereo sources such as a tape player, phonograph, CD player, stereo radio, etc.

Channel control modules 24L and 24R contain circuitry for controlling various parameters such as loudness, equalization and time delay; each channel can be controlled independently, and control may be applied either manually or through control signals on control lines 26L and 26R. These control signals originate in a command module 28 that receives via IR sensor 30 an IR beam 32 originating in a hand-held remote control unit 34 that is located at the listening location 10.

The equipment described to this point may be considered as presently available or known. Many stereo systems are equipped with a remote control of some kind; capabilities range from a simple remote control system providing perhaps only volume (loudness) and amplitude balance as remotely controllable, to much more elaborate remote control systems which may provide, for example, overall EQ, EQ balance i.e. individual channel EQ, with varying degrees of EQ range and number of bands. In unusually sophistocated systems, individual channel time delay may be provided and made capable of remote control. A further but presently unusual capability would include capability of introducing and adjusting some form of channel cross-coupling as indicated by dashed cross-coupling paths 38A and 38B; this would involve numerous options of polarity and frequency dependence, to control such aspects as ambience and imaging.

With the more sophistocated remote control capabilities, a listener at an asymmetric location 10 can manually operate the remote control unit 34 in a manner to make adjustments in each of those parameters which are controllable, in order to optimize the sound quality as perceived at location 10. However, as noted previously, such manual adjustments become more tedious and difficult as the number of controlled parameters increases, so that a highly sophistocated system tends to become somewhat unmanageable due to interactions of the different parameters and the subjective nature of a human listener manipulating many parameters in attempting to optimize the perceived sound.

Automatic stereo setup provided by the present invention would adjust the available parameters automatically to favor a particular listening location, based on a brief test and setup routine that evaluates the performance of each parameter on each channel at the listening location. The test and setup routine can be initiated manually on the hand-held remote control unit, or optionally the routine could be made self-initiating upon moving the remote control unit to a new listening location. Automatic setup has the advantage of being quick, scientific and effortless, relieving the user of the trial and error typical of manual setup.

A key element in automatic stereo setup capability according to the present invention is a microphone 36 installed in the remote control unit 34 along with electronic circuitry for amplifying and possibly analyzing the signal from microphone 36, and for sending related information to the main command module 28 via the IR link 32.

The command module 28 includes with a test signal generator which can, on user or automatic command, deliver a special test signal to each loudspeaker. Microphone 36 receives the resultant acoustic signals; these are analyzed and, if correction is needed, information is sent on the IR link to the command module 28 for acuating controllers 24L and 24R to provide the necessary compensation.

As an example of a basic automatic system for amplitude balance, modules 24L and 24R are gain-controlled via lines 26L and 26R and the command module 30 is made to generate suitable test tones through loudspeakers 14L and 14R. In response to an "initiate" command from the remote control unit 34, command module 28 applies a 400 Hz tone burst sequentially to loudspeaker 14L via module 24L and then to loudspeaker 14R via module 24R. Microphone 36 picks up the resulant acoustic signals, which are amplified by circuitry in the remote control unit 34, then analyzed; the respective amplitudes are easily detected due to their known sequence following the "initiate" command entered by the user. Any unbalance found in the analysis can then be corrected through automatic actuation of the remote control 36 to make the necessary balance adjustment of gain controlled amplifiers in modules 24A and 24B. A full correction can be made in the one step as described by making the analysis quantitive and providing the necessary accuracy in estimating and deploying the compensation. Alternatively, in an reiterative routine, the signal could continue in a set sequence of steps, e.g. a L/R comparison is made and, if necessary, compensation is incremented; stepping continues in this manner until the L/R comparison indicates that balance has been reached, whereupon the routine is terminated.

The above-described method of automating stereo balance adjustments according to the present invention can be extended to practically any number of controllable parameters.

In the case of channel EQ, with the spectrum divided into a designated number of separately controllable frequency bands, the command module 30 is made to provide appropriate frequencies in the test signal, corresponding to each band, (typically the frequency would be midband), and the test routine provides independent gain adjustment for each band in each channel.

In the case of time delay balance, the test signal may be a pulse instead of a tone, and the analysis involves comparisons of arrival times of the L and R pulses at microphone 36. Time delay compensation would involve introducing a variable time delay into at least one of the two channels in modules 24L and/or 24R. In the case of listening location 10 of FIG. 1, delay would be introduced into the left channel to add to the delay in path 12L in an amount to make the total delay in the left channel equal to that in the longer path 12R. Again, as described above, the routine could be made one step or reiterative as a matter of design choice.

Figure 2:
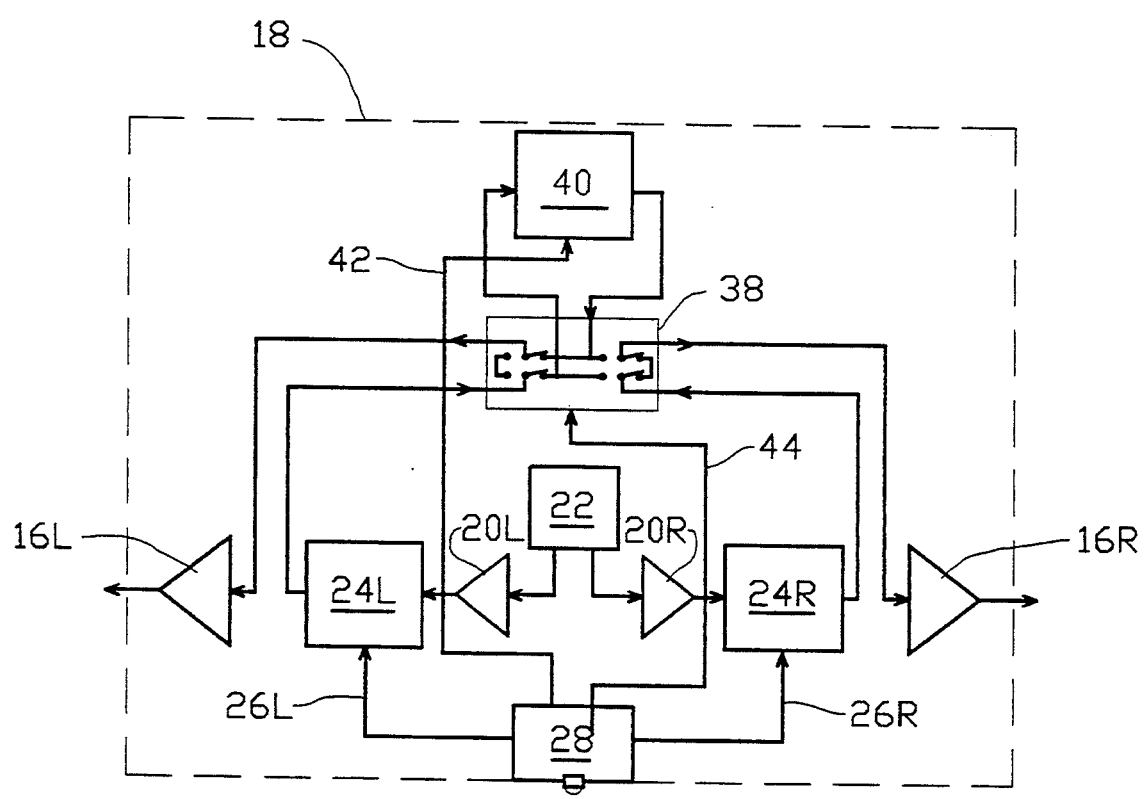
FIG. 2 is a simplified functional block diagram illustrating a main stereo unit for operation as in FIG. 1 to automatically compensate for time delay unbalance in the acoustic paths of an asymmetric listening location.

FIG. 2 illustrates a main stereo unit 18 equipped to provide automatic time delay compensation. A switcher 38 can interpose a variable time delay module 40 into either channel, so that only one delay module is required; this economy is possible since delay is not needed in both channels simultaneously. Switcher 38 and time delay module 40 receive control input from command module 24. For a symmetrical listening location, module 40 would be set for zero time delay, so that the two channels would be balanced with respect to time delay. For asymmetrical listening locations, additional delay is introduced into the channel with the shorter acoustic path.

With the time delay system of FIG. 2 operating in the scenerio of FIG. 1, in consequence of a test signal and analysis, command module 28 actuates switcher 38 (FIG. 2) to switch time delay module 40 into the left channel and causes the delay in module 40 to be automatically adjusted to equal to the sensed time difference so that the total delay in the left channel is made equal to the right channel delay in path 16 (FIG. 1). Thus the stereo source images are made to sound equidistant and spatially balanced as perceived by the listener at location 10.

As an option to the fully automatic mode, manual modes may be provided allowing the user to make selected manual adjustments via the remote control for subjective optimization. Loudness is generally adjusted by the user, and would not normally be adjusted automatically.

It is believed that at this time the detailed design of electronic circuitry to implement the various functions in the functional blocks shown in this invention falls well within the capability of those skilled in the electronic arts, given the present disclosure. Some of the modules may be available as off-the-shelf items: for example, switcher 38 and time delay module 40, and it is believed such modules will become even more readily available and economical in future electronic evolution.

The remote control link 32 is shown as being an IR link for illustrative purposes, since IR links are widely used for this type of remote control; however the invention can be practiced with the remote control link 32 implemented in other media such as r.f. or ultra sound.

The function of analyzing the output of microphone 36 and deriving appropriate control signals can be performed either in the remote control unit or in command module 28, or this function can be divided between these two in any suitable proportion as a matter of design choice, along with a suitable encoding scheme to transmit the sensed test/correction data on the IR link.

The invention is shown in the present embodiments as directed to a stereophonic sound system for illustrative purposes due to the prevalence of stereo sound systems: however the invention may be readily practiced with multi-channel sound systems having three, four or more channels.

The invention may be embodied and practiced in other specific forms without departing from the spirit and essential characteristics thereof. The present embodiments are therefore to be considered in all respects as illustrative and not restrictive, the scope of the invention being indicated by the appended claims rather than by the foregoing description; and all variations, substitutions and changes which come within the meaning and range of equivalency of the claims are therefore intended to be embraced therein.

What is claimed is:

1. A remote control system with automatic and manual capabilities in a multi-channel sound reproduction system having a plurality of associated loudspeaker units, a multi-channel amplifying means operationally coupled to drive the loudspeaker units, a command module operationally coupled to control circuitry in the amplifying means, and receiving commands via a wireless link, whereby any selected one of a plurality of adjustable operating parameters may be adjusted in the amplifying means, said remote control system comprising:

a remote control unit, in a hand-held housing held by a listener located at a particular listening location, transmitting commands to the command module via the wireless link in response to manual key entries by the listener, whereby the listener can manually control said sound reproduction system with regard to manually-selectable parameters;

a microphone, disposed in the hand-held housing of said wireless remote control unit, providing an output signal representing sound emanating from the loudspeaker units;

electronic audio processing circuit means, having a signal path that includes the wireless link, receiving as input the output signal of said microphone and processing the output signal in a manner to determine need for compensatory adjustment of a predetermined parameter and, when such need is determined, to cause a compensatory adjustment to be made, via the command module, in the predetermined parameter in at least one channel, whereby said sound reproduction system is automatically adjusted with regard to the predetermined parameter as perceived by the microphone at the particular listening location.

2. The remote control system as defined in claim 1 further comprising:

electronic signal generator circuit means, controllable from the remote control unit, having capability of delivering to each channel a designated audio test signal formulated so as to enable evaluation of the predetermined parameter as perceived by the microphone from each channel independently, and said electronic audio processing circuit means being made responsive to the microphone output signal in a manner to adjust the control circuitry to compensate for differences between the channels regarding acoustic transmission characteristics.

3. The automatic adjustment system as defined in claim 2 wherein the multi-channel system is a stereo system and automatic adjustment is directed to channel-to-channel equalization, and wherein the audio test signal is sequentially changed to different frequencies each associated with a corresponding frequency band of a remotely controllable multi-band equalizer provided in the stereo system.

4. The automatic adjustment system as defined in claim 2 wherein the multi-channel system is a stereo system and automatic adjustment is directed to delay time compensation, and wherein the audio test signal comprises pulsed time markers and the stereo system further comprises a variable time delay module and switching means for interposing the time delay module into a main signal path of a selectable one of two stereo channels, whereby, for an asymmetrical listening location, the variable time delay module can be automatically switched into one of the channels sensed as having a shorter acoustic path from the corresponding loudspeaker to the microphone, and the variable time delay module can be automatically adjusted to introduce a corrective time delay equal to a difference in audio propagation time between acoustic paths from corresponding ones of the loudspeakers to the microphone.

5. The automatic adjustment system as defined in claim 2 wherein the multi-channel system is a stereo system and automatic adjustment is directed to channel-to-channel amplitude balance adjustment, and wherein the audio test signal alternates sequentially between two channels of the stereo system.

6. A hand-held wireless remote control unit, for adjustment of each of a plurality of adjustable operating parameters of a stereophonic sound reproduction system from a listening location, providing, in addition to conventional capability of manually adjusting the system via a wireless link, additional capability of automatic corrective adjustment of at least one channel with regard to a preselected one of the parameters relating to acoustic transmission characteristics, comprising:

a microphone, built into a housing of said wireless remote control unit, receiving sound from each channel of the sound reproduction system at the listening location;

electronic circuit means receiving signal input from said microphone relating to the preselected parameter of the sound received from each channel, and providing therefrom control information that enables the automatic corrective adjustment of the parameter to be applied to at least one channel of the sound reproduction system, said electronic circuit utilizing the wireless link for conveying microphone-originated control information, in addition to regular manually-entered control information, to the stereophonic reproduction system.

7. The remote control unit as defined in claim 6 wherein said electronic circuit means is directed to loudness and adjustment of audio gain in each channel of the sound reproduction system, so as to enable automatic adjustment of loudness balance as perceived at the listening location.

8. The remote control unit as defined in claim 6 wherein said electronic circuit means is directed to audio frequency equalization in each channel of the sound reproduction system, so as to enable automatic adjustment of overall equalization and balance as perceived at the listening location.

9. The remote control unit as defined in claim 6 wherein said electronic circuit means is directed to time delay in each channel of the sound reproduction system, so as to enable automatic insertion and adjustment of time delay into one of the channels to compensate for inter-channel difference in time delay as perceived at the listening location.

10. A method of automatically adjusting at least a predetermined one of a plurality of operating parameters in a stereo system that includes a main stereo module driving a pair of loudspeakers, a hand-held wireless remote control unit located at a desired listening location and capable of sending manually-entered control data to the main stereo module via a wireless link, and a command module responsive to the remote control unit for adjusting the parameters, the method comprising the steps of:

- causing the command module to supply a test signal to the loudspeakers for evaluating the predetermined parameter;
- sensing resultant acoustic signals from the loudspeakers with a microphone located in a housing of the wireless remote control unit;
- deriving, from signals sensed by the microphone, information relating to the predetermined parameter as sensed from each of the loudspeakers;
- transmitting the information from the wireless remote control unit to the main stereo module via a wireless transmission path;
- electronically analyzing the derived information to determine a corrective adjustment requirement relating to the predetermined parameter;
- communicating the corrective adjustment requirement to the command module so as to cause the command module to perform an appropriate corrective adjustment with regard to the predetermined parameter.

11. An automatic adjustment system in a stereo sound reproduction system having a plurality of associated loudspeaker units, a stereo amplifier operationally coupled to drive the loudspeaker units, a command module operationally coupled to control circuitry in the amplifier, the command module being operable via a wireless path from a hand-held wireless remote control unit that is located at a particular listening location, whereby any selected one of a plurality of adjustable operating parameters of the amplifier, including gain, may be controlled in response to commands entered manually on the remote control; said improvement, enabling automatic balancing of channel-to-channel delay time, comprising:

- electronic signal generator circuit means, controlled from the command module, having capability of delivering a designated audio test signal containing pulsed time markers selectively to the loudspeaker units upon receipt by the command module of a test-initiating signal from the remote control;
- a microphone, contained within a housing of the remote control unit, providing an output representing sound emanating from the loudspeaker units, the audio test signal being formulated so as to enable comparison of the delay time of the two channels as perceived by the microphone in the acoustic transmission paths from the speaker units;
- electronic audio processing circuit means, receiving as input an evaluation signal derived from the output of said microphone, for processing the evaluation signal in a manner to detect and evaluate unbalance of the delay time of the two channels, and, when such unbalance is found, to cause the command module to introduce a compensatory delay time in one of the channels so as to balance the delay time of the two channels as perceived by the microphone, thus enhancing sound quality from said sound reproduction system as perceived by a listener at the listening location by automatically balancing the delay times of the two channels.

* * * * *